United States Patent
Kohno (12)
(10) Patent No.: US 6,603,530 B1
(45) Date of Patent: Aug. 5, 2003

(54) EXPOSURE APPARATUS THAT ILLUMINATES A MARK AND CAUSES LIGHT FROM THE MARK TO BE INCIDENT ON A PROJECTION OPTICAL SYSTEM

(75) Inventor: Michio Kohno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/650,904

(22) Filed: Aug. 30, 2000

(30) Foreign Application Priority Data

Sep. 1, 1999 (JP) ............................ 11-247152

(51) Int. Cl.⁷ ........................ G03B 27/42; G03B 27/32; G03B 27/52; G30B 27/54
(52) U.S. Cl. ............................ 355/53; 355/55; 355/77; 355/67
(58) Field of Search ................ 355/53, 55, 67, 355/52, 71, 77; 359/820; 250/548; 356/399, 400, 401

(56) References Cited

U.S. PATENT DOCUMENTS

| | | | |
|---|---|---|---|
| 4,583,840 A | | 4/1986 | Yabu et al. .............. 355/30 |
| 5,721,608 A | * | 2/1998 | Taniguchi .............. 355/53 |
| 5,805,273 A | | 9/1998 | Unno .............. 355/30 |
| 5,883,704 A | * | 3/1999 | Nishi et al. .............. 355/67 |
| RE36,799 E | * | 8/2000 | Nishi .............. 250/401 |
| 6,262,793 B1 | * | 7/2001 | Sasaya et al. .............. 355/53 |

FOREIGN PATENT DOCUMENTS

| | | |
|---|---|---|
| JP | 7-183190 | 7/1995 |
| JP | 10-50585 | 2/1998 |
| JP | 10-54932 | 2/1998 |
| KR | 0187348 | 12/1998 |

* cited by examiner

*Primary Examiner*—Russell Adams
*Assistant Examiner*—Peter B. Kim
(74) *Attorney, Agent, or Firm*—Fitzpatrick, Cella, Harper & Scinto (57) ABSTRACT

An exposure apparatus wherein a first object is illuminated with slit-like exposure light while the first object and a second object are scanningly moved at a speed ratio corresponding to a projection magnification of a projection optical system such that a pattern of the first object is projected onto the second object through the projection optical system. The apparatus includes an illuminating device for illuminating a mark provided on the first object side with light having the same wavelength as that of the exposure light, wherein light from the mark is incident on the projection optical system whereby a revolutionally asymmetric aberration of the projection optical system due to an exposure is corrected or reduced.

12 Claims, 6 Drawing Sheets

EXPOSURE APPARATUS THAT ILLUMINATES A MARK AND CAUSES LIGHT FROM THE MARK TO BE INCIDENT ON A PROJECTION OPTICAL SYSTEM

FIELD OF THE INVENTION AND RELATED ART

This invention relates to an exposure method and a scanning exposure apparatus using the same. The present invention is suitably usable, for example, for photoprinting a photomask pattern (reticle pattern) illuminated with slit-like light on a wafer while synchronously scanning the photomask and the wafer relative to the slit-like light and a projection optical system, for the manufacture of a semiconductor device such as an IC or LSI, an image pickup device such as a CCD, a display device such as a liquid crystal panel, or a device such as a magnetic head, for example.

The semiconductor device manufacturing technology has advanced remarkably, and the microprocessing technology has also advanced notably. Particularly, as regards reduction projection exposure apparatuses having a resolving power of submicron order, which play a major role in the optical processing technology, enlargement of a numerical aperture (NA) and shortening of exposure wavelength have been attempted, for further improvement of the resolution.

Also, changing a unit-magnification scanning exposure apparatus using a conventional reflection projection optical system has been proposed. That is, there is a scanning exposure apparatus which includes a reduction projection optical system comprising a combination of reflective and refractive optical elements (catadioptric system), or a reduction projection optical system comprising refractive elements only, wherein a mask stage for a photomask and a wafer stage for a photosensitive substrate are scanningly moved in synchronism with each other and at a speed ratio corresponding to the reduction magnification.

Figure 8:
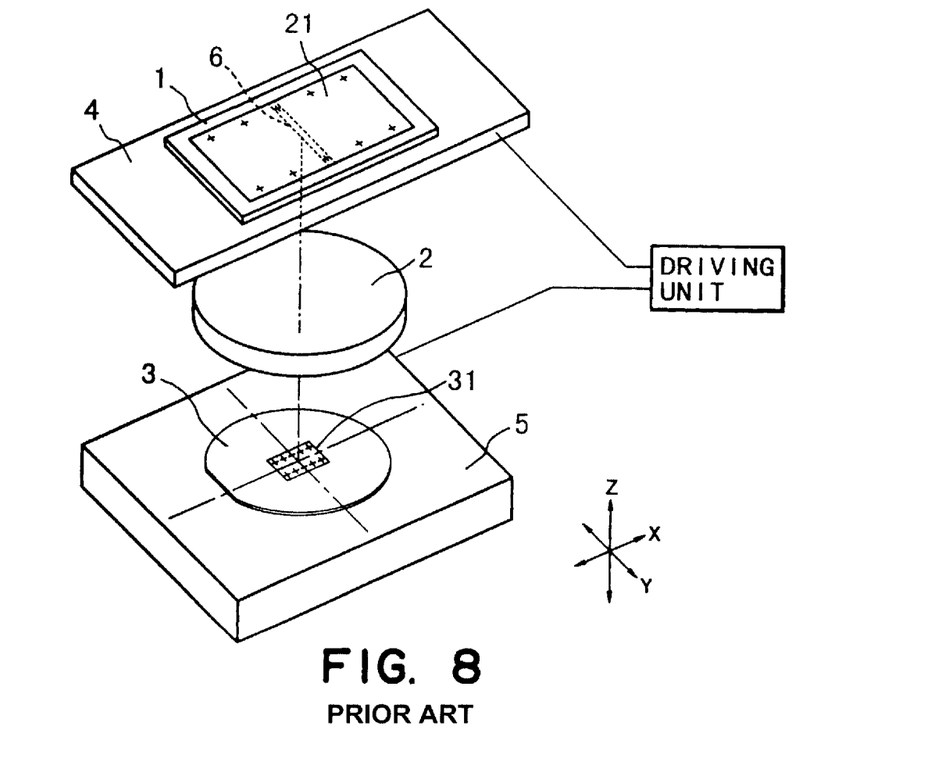
FIG. 8 is a schematic view for explaining the principle of a scan type exposure apparatus.

FIG. 8 is a schematic view of a main portion of such a scanning exposure apparatus of a step-and-scan type. In the drawing, a mask 1 has a device pattern (original pattern) 21 formed thereon, and it is supported by a mask stage 4. A wafer (photosensitive substrate) 3 is supported by a wafer stage 5. The mask 1 and the wafer 3 are disposed at positions being optically conjugate with each other with respect to a projection optical system 2. Slit-like exposure light 6 being elongated in the Y direction in the drawing is supplied from an illumination system (not shown), and it illuminates the mask 1. Then, the pattern of the mask 1 as illuminated is imaged upon the wafer 3, at a size determined by the projection magnification of the projection optical system 2.

The scan exposure is accomplished by moving, through a driving unit, the mask stage 4 and the wafer stage 5 relative to the slit-like exposure light 6 and the projection optical system 2, in the X direction and at a speed ratio corresponding to the optical magnification. Thus, by scanning the mask 1 and the wafer 3 relative to the exposure light 6 and the projection optical system 2, the whole device pattern 21 of the mask 1 is transferred to a transfer region on the wafer 3.

In the scanning exposure apparatus based on the step-and-scan exposure method, when the scan exposure of one shot (31) upon the wafer 3 is completed, the wafer stage 5 carrying the wafer 3 thereon is moved by a predetermined amount, and the scan exposure of a next shot on the wafer is then carried out. This operation is repeated to perform exposures of the whole wafer.

In such a scanning exposure apparatus, since the exposure region has a rectangular or slit-like shape, the lens elements of the projection optical system 2 are illuminated with light of a rectangular shape or of an elliptical shape (the slit-like shape is expanded in accordance with an extension of the illumination light flux), the shape being determined at the location where the lens element is placed. This means that the rectangular or slit-like region of each lens element is heated by the light.

As the exposure procedure goes on, such a heating environment may cause revolutionally asymmetric deformation of the projection lens and produce a revolutionally asymmetric aberration. For example, an astigmatism aberration may be caused in the light being imaged on the wafer 3, which may largely degrade a device pattern image thereon.

This tendency becomes notable as the printing wavelength is shortened from i-line (365 nm) to a deep ultraviolet region (248 nm or 193 nm), because, in physical properties, the light is absorbed more by the glass material.

Japanese Laid-Open Patent Application, Laid-Open No. 50585/1998 proposes a solution for this problem.

SUMMARY OF THE INVENTION

It is an object of the present invention to provide an exposure method and a scanning exposure apparatus using the same, by which production of a revolutionally asymmetric aberration such as described above can be reduced effectively, in a different way than as proposed in the aforementioned Japanese patent application.

In accordance with an aspect of the present invention, there is provided an exposure method wherein a first object is illuminated with a slit-like light beam while the first object and a second object are scanningly moved at a speed ratio corresponding to a projection magnification of a projection optical system such that a pattern of the first object is projected onto the second object through the projection optical system, characterized by illuminating a mark provided on the first object side with exposure. light, wherein light from the mark is incident on the projection optical system whereby a revolutionally asymmetric aberration of the projection optical system due to an exposure is corrected or reduced.

In accordance with another aspect of the present invention, there is provided an exposure method wherein a first object is illuminated with a slit-like light beam while the first object and a second object are scanningly moved at a speed ratio corresponding to a projection magnification of a projection optical system such that a pattern of the first object is projected onto the second object through the projection optical system, characterized by illuminating a mark provided on a stage for the first object, wherein light from the mark is incident on the projection optical system whereby a revolutionally asymmetric aberration of the projection optical system due to an exposure is corrected or reduced.

In accordance with a further aspect of the present invention, there is provided an exposure method wherein a first object is illuminated with a slit-like light beam while the first object and a second object are scanningly moved at a speed ratio corresponding to a projection magnification of a projection optical system such that a pattern of the first object is projected onto the second object through the projection optical system, characterized by illuminating a mark provided on the first object side with exposure light, wherein light from the mark is incident on the projection optical system whereby at least one lens of the projection optical system is substantially thermally saturated.

In accordance with a yet further aspect of the present invention, there is provided an exposure method wherein a first object is illuminated with a slit-like light beam while the first object and a second object are scanningly moved at a speed ratio corresponding to a projection magnification of a projection optical system such that a pattern of the first object is projected onto the second object through the projection optical system, characterized by illuminating a mark provided on a stage for the first object, wherein light from the mark is incident on the projection optical system whereby at least one lens of the projection optical system is substantially thermally saturated.

In accordance with a still further aspect of the present invention, there is provided an exposure method for projecting a pattern of a first object onto a second object through a projection optical system, characterized by illuminating a mark provided on the first object side with exposure light, wherein light from the mark is incident on the projection optical system whereby a revolutionally asymmetric aberration of the projection optical system due to an exposure is corrected or reduced.

In accordance with another aspect of the present invention, there is provided an exposure method for projecting a pattern of a first object onto a second object through a projection optical system, characterized by illuminating a mark provided on a stage for the first object with exposure light, wherein light from the mark is incident on the projection optical system whereby a revolutionally asymmetric aberration of the projection optical system due to an exposure is corrected or reduced.

In accordance with a yet further aspect of the present invention, there is provided an exposure method for projecting a pattern of a first object onto a second object through a projection optical system, characterized by illuminating a mark provided on the first object side with exposure light, wherein light from the mark is incident on the projection optical system whereby at least one lens of the projection optical system is substantially thermally saturated.

In accordance with a further aspect of the present invention, there is provided an exposure method for projecting a pattern of a first object onto a second object through a projection optical system, characterized by illuminating a mark provided on a stage for the first object, wherein light from the mark is incident on the projection optical system whereby at least one lens of the projection optical system is substantially thermally saturated.

In these aspects of the present invention, the illumination of the mark on the first object side may be performed before a regular shot exposure to the wafer and/or between shot exposures to the wafer.

The mark may be provided on a movable stage on which the first object is placed.

The mark may comprise a light diverging element for producing light which is revolutionally asymmetric with respect to an optical axis of the projection optical system.

The mark may comprise a light diverging element for diffusing light incident thereon, mainly along a scan direction.

The light from the mark may be incident on a region of the projection optical system, which region is revolutionally symmetric with respect to an optical axis thereof.

The light from the mark may be incident on a complementary region, for an irradiation region on a lens of the projection optical system for exposure of a shot of the second object.

The first object may be illuminated with a slit-like light effective to define an illumination region of rectangular or arcuate shape on the first object.

The projection optical system may include plural lenses.

In accordance with a yet further aspect of the present invention, there is provided a scanning exposure apparatus for performing an exposure process in accordance with an exposure method as recited above.

In accordance with a yet further aspect of the present invention, there is provided an exposure apparatus for performing an exposure process in accordance with an exposure method as recited above.

In accordance with a still further aspect of the present invention, there is provided a device manufacturing method for exposing a wafer to a device pattern by use of an exposure method as recited above, and for developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
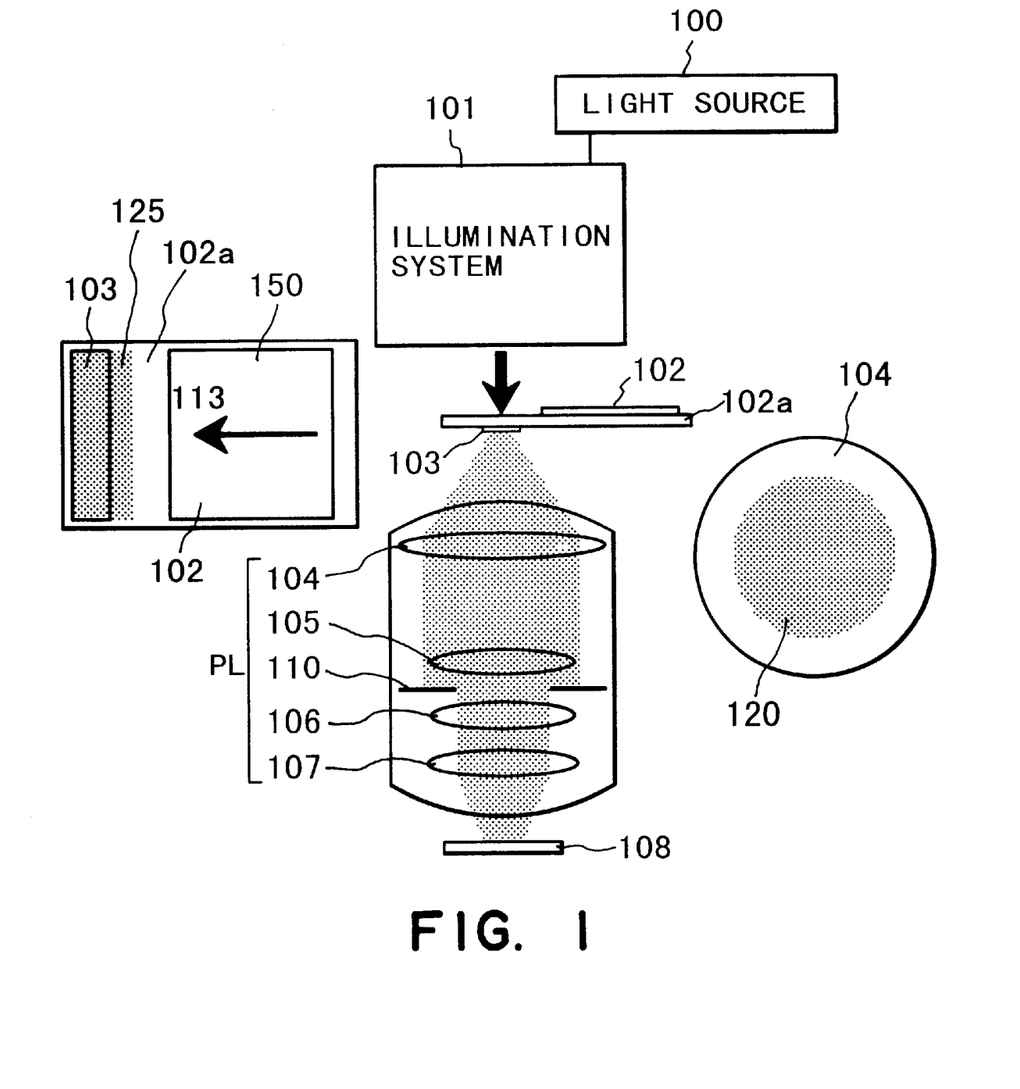
FIGS. 1 and 2 are schematic views, respectively, of a main portion of a scanning exposure apparatus which uses an exposure method according to a first embodiment of the present invention.
Figure 2:
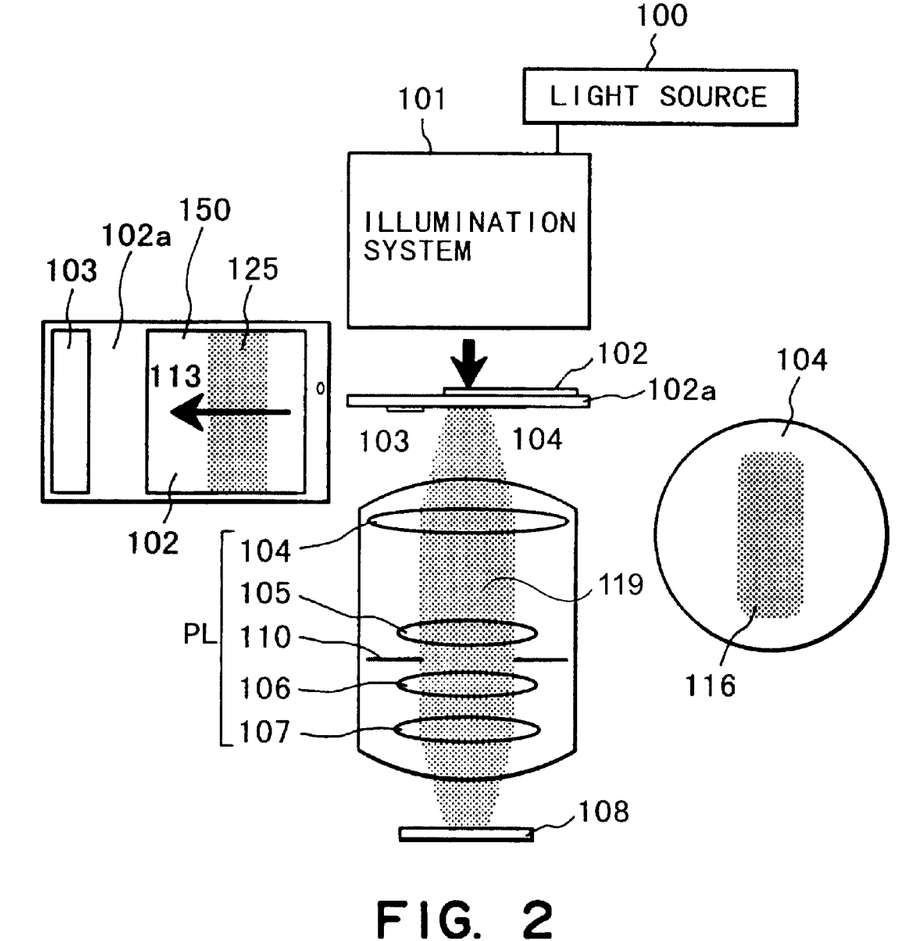

FIGS. 1 and 2 are schematic views, respectively, of a first embodiment wherein the exposure method of the present invention is applied to a scan type exposure apparatus. Specifically, FIG. 2 shows the irradiation range of exposure light in the scanning exposure apparatus. The structures of the optical systems in FIGS. 1 and 2 are exactly the same.

The first embodiment concerns a step-and-scan type exposure apparatus wherein light emitted from a light source 100 is projected through an illumination system (illumination optical system) 101 onto a reticle (mask) 102. In response thereto and by scanningly moving the reticle 102 and a wafer 108, a circuit pattern formed on the reticle 102 is projected in a reduced scale through a projection lens (projection optical system) PL and printed thereby on the wafer 108 having a photosensitive material applied thereto. Such a scanning exposure apparatus is suitably usable for the manufacture of semiconductor devices such as ICs or LSIs, image pickup devices such as CCDs, display devices such as liquid crystal panels, or devices such as magnetic heads, for example.

In FIGS. 1 and 2, an exposure light beam emitted from the light source 100, which may comprise a laser or an ultra-high pressure Hg lamp, is directed to the illumination system 101, by which the light is transformed into an illumination light beam having a predetermined numerical aperture, a predetermined illuminance, a predetermined light intensity and a predetermined uniformness and being effective to define a predetermined rectangular illumination region. The illumination light then illuminates a reticle (second object) 102.

Here, as shown in the left-hand side portion of the drawing, an irradiation region 125 to be defined on the reticle 102 has a rectangular shape. For a practical 6-inch reticle, the irradiation region may have a size of about 104 mm×132 mm. The reticle 102 can be scanningly moved relative to the projection lens PL, in a direction of an arrow 113.

In the scanning exposure apparatus of this embodiment, as shown in FIG. 2, when an actual device pattern region 150 of the reticle 102 is illuminated, those portions of the lens elements 104, 105, 106, and 107 of the projection lens PL which are located in a space 119 through which, of the illumination light beam (exposure light), zero-th order light coming mainly from the actual device pattern region 150 passes, are strongly heated by the exposure.

The illustration at the right-hand side portion of FIG. 2 shows a section of the lens 104, along a plane orthogonal to the optical axis, where the tendency described above appears most notably, since the lens 104 is closest to the reticle 102.

The region on the lens 104 section as depicted by hatching is an illumination region 116. This illumination region 116 has a rectangular shape, and it shows that this region of the lens 104 is strongly heated during the exposure. During the exposure for an ordinary one shot, substantially the same phenomenon occurs in the other lenses 105, 106 and 107. These lenses 104–107 are mechanically held with their refractive surfaces kept revolutionally symmetric with respect to the optical axis. Therefore, when such revolutionally asymmetric heating continues, it causes revolutionally asymmetric deformation in the lenses 104–107 with respect to the optical axis.

More specifically, the refractive surface of each lens 104–107 is deformed into a shape wherein, in the rectangular illumination region, the curvature radius in the lengthwise direction thereof differs from that in the widthwise direction thereof, namely, a shape of a toric surface. It results in generation of an astigmatism aberration in the projection lens PL as described hereinbefore.

In accordance with this embodiment, to avoid such inconveniences, a preparatory exposure step is carried out by using a mark 103 specifically provided on a reticle stage 102a.

More particularly, in this embodiment, as shown in FIG. 1, before a regular exposure, the reticle stage 102a is moved to place a lens illumination mark 103 (preparatory exposure mark) provided on the reticle stage 102a beforehand at a position where a rectangular illumination region 125 can be defined by the illumination system 101. While keeping the reticle stage at that position, the lens illumination mark 103 as well as a portion around it are illuminated by a rectangular light beam (exposure light) for a predetermined time period, such that the projection lens PL is illuminated by light from the mark 103. This is the preparatory exposure. During this preparatory exposure, the wafer 108 is kept so that there is no shot region of the wafer placed below the projection lens PL.

Figure 6:
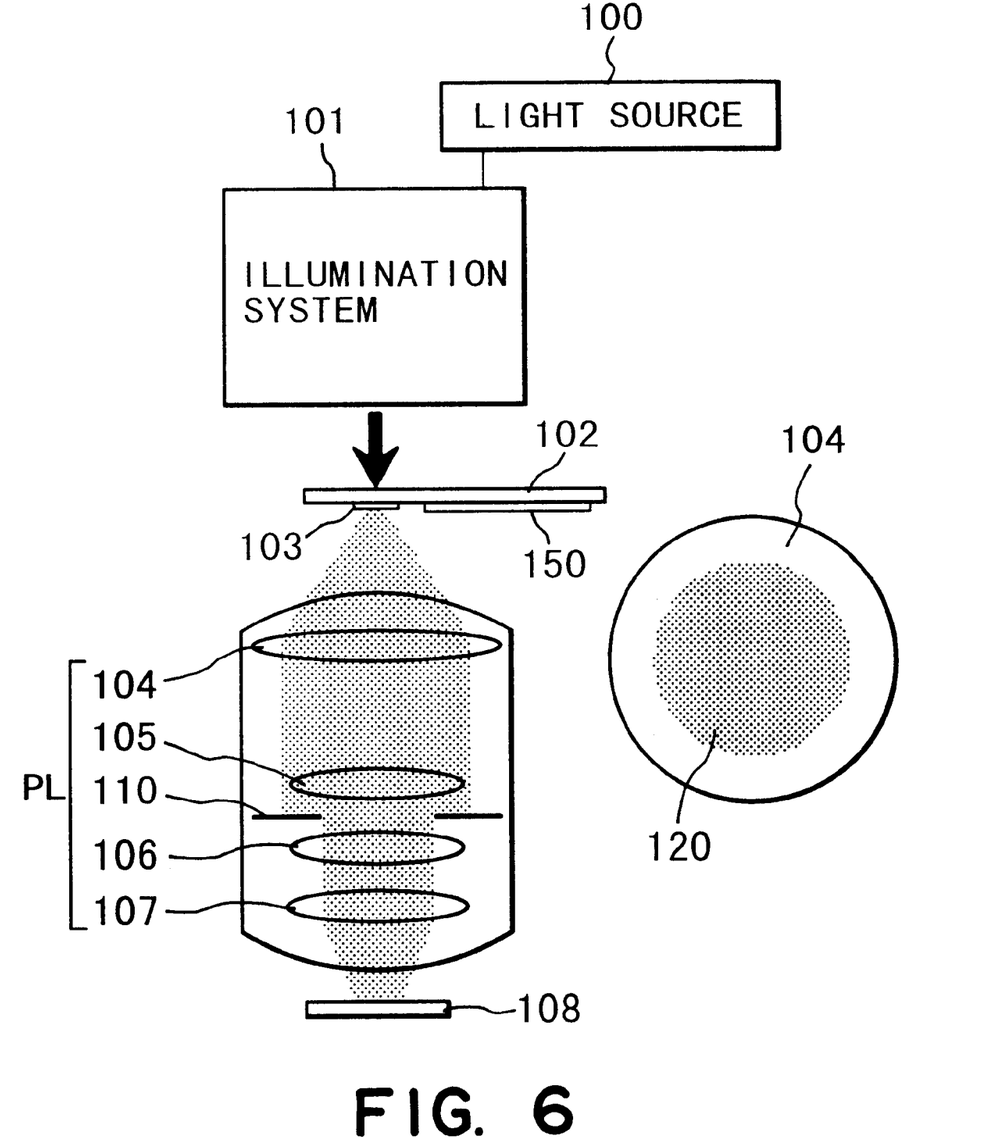
FIG. 6 is a schematic view of a scanning exposure apparatus of an example wherein a portion of the FIG. 1 embodiment is modified.

The lens illumination mark 103 may be formed at any position, provided that the mark can be irradiated with illumination light. For example, as shown in FIG. 6, it may be formed on a reticle 102. The scanning exposure apparatus of the FIG. 6 example has substantially the same structure as that of the embodiment of FIG. 1, except that the lens illumination mark 103 is provided on the reticle 102.

Referring back to FIG. 1, the region inside the projection lens PL as depicted by hatching is an illumination space inside the lens in that state. The illustration at the right-hand side portion of the drawing corresponds to the illustration at the right-hand side portion of FIG. 2, and it shows the illumination region (hatched region) on the section of the lens 104, along a plane orthogonal to the optical axis.

In this embodiment, the lens illumination mark 103 comprises a light diverging element in which the illumination light is transformed into a divergent light beam which is revolutionally symmetric with respect to the optical axis. This divergent light beam is then projected on the lenses 104–107 of the projection lens PL so that it defines an illumination region on each lens, which region is revolutionally symmetric with respect to the optical axis.

More specifically, as shown in the right-hand side portion of FIG. 1, the lens 104 is so illuminated that an illumination region 120 which is substantially revolutionally symmetric is defined on the lens 104, as contrasted to that shown in the illumination region 116 at the right-hand side portion of FIG. 2. This illumination is made so as to substantially thermally saturate the projection lens PL as a whole. As a result of it, when the lens is irradiated thereafter by revolutionally asymmetric illumination light for an ordinary exposure process (exposure of each shot), there does not occur a revolutionally asymmetric aberration such as an astigmatism in the lens.

Figure 3:
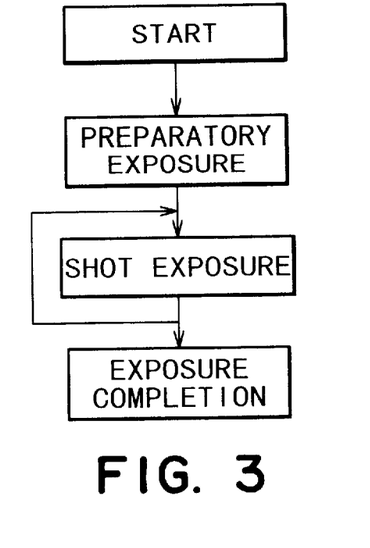
FIG. 3 is a flow chart for explaining the timing of a preparatory exposure in the exposure method according to the present invention.

FIG. 3 is a flow chart for explaining the timing of the preparatory exposure in this embodiment.

In this embodiment, as described above, a preparatory exposure mark (light diverging element) is provided on a movable reticle stage (102a), and the mark is illuminated with exposure light. By means of the diffused light (it may be diffractive light or scattered light) produced by the preparatory exposure mark, a circular region of the projection lens glass material, which region is revolutionally symmetric with respect to the optical axis and which region contains a zone not to be illuminated during the ordinary exposure (regular shot exposure), is heated to thereby keep the lens in a thermally symmetrically heated state. Then, the ordinary exposure process is performed. This procedure effectively prevents generation of a revolutionally asymmetric aberration in the projection optical system.

FIGS. 4A–4D are sectional views for explaining some examples of a lens illumination mark (light diverging element) to be used as a preparatory exposure mark in this embodiment.

Figure 4A:
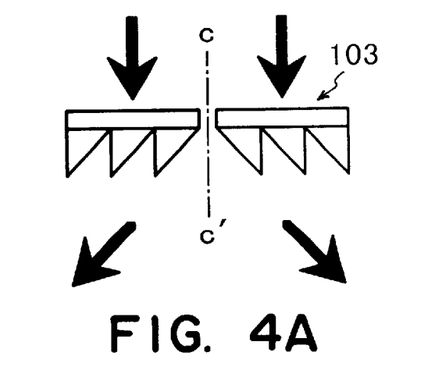
FIGS. 4A–4D are schematic views, respectively, for explaining a preparatory exposure mark according to the present invention.

FIG. 4A is a sectional view of a lens illumination mark wherein the mark comprises a deflection prism having a revolutionally symmetric axis along an axis C–C'. Along a plane containing this axis C–C', the lens illumination mark 103 has a repetition structure of very small triangular prisms, and it has a function for deflecting light incident thereon as illustrated by arrows. In the region of the lens illumination mark 103, there are a number of triangular prisms (as shown in FIG. 4A) formed.

Figure 4B:
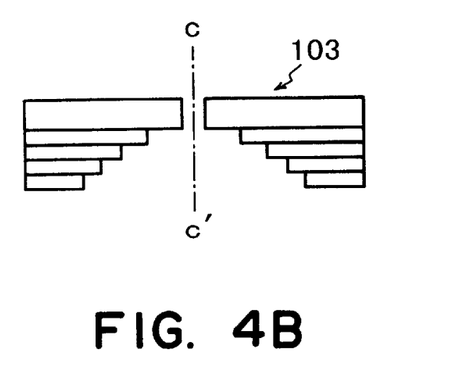

In the example of FIG. 4B, the lens illumination mark 103 comprises a diffractive element (binary optics) with a stepped shape, having substantially the same function as that of the mark in FIG. 4A.

Figure 4C:
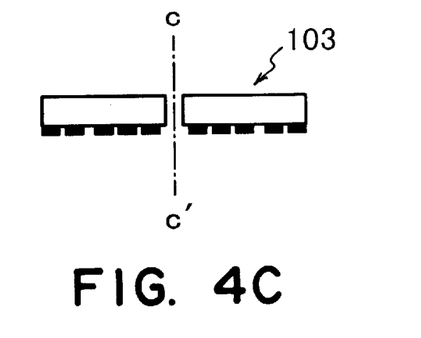

In the example of FIG. 4C, the lens illumination mark 103 comprises an amplitude type diffraction grating made of a light blocking material such as chromium, for example, and having substantially the same function as that of the mark of FIG. 4A.

In the example of FIG. 4C, the lens illumination mark 103 comprises an amplitude-type diffraction grating made of a light blocking material such as chromium, for example, and having substantially the same function as of the mark of FIG. 4A.

Figure 4D:
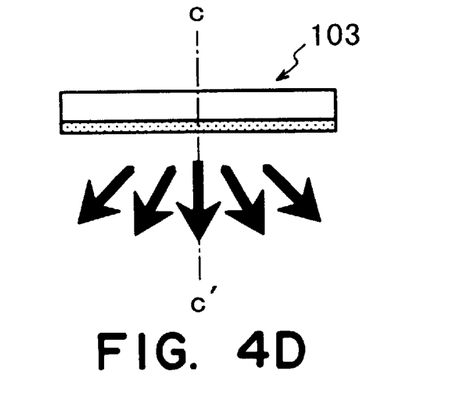

In the example of FIG. 4D, the lens illumination mark 103 comprises a diffusion plate, wherein the roughness of its light diffusing surface is adjusted to set the directivity of transmitted light thereof close to those of the marks of FIGS. 4A–4C.

As regards the light diverging element, it is to be noted that, in addition to the marks described above, an optical wedge element, a lenticular plate element or the like may be used.

Figure 5:
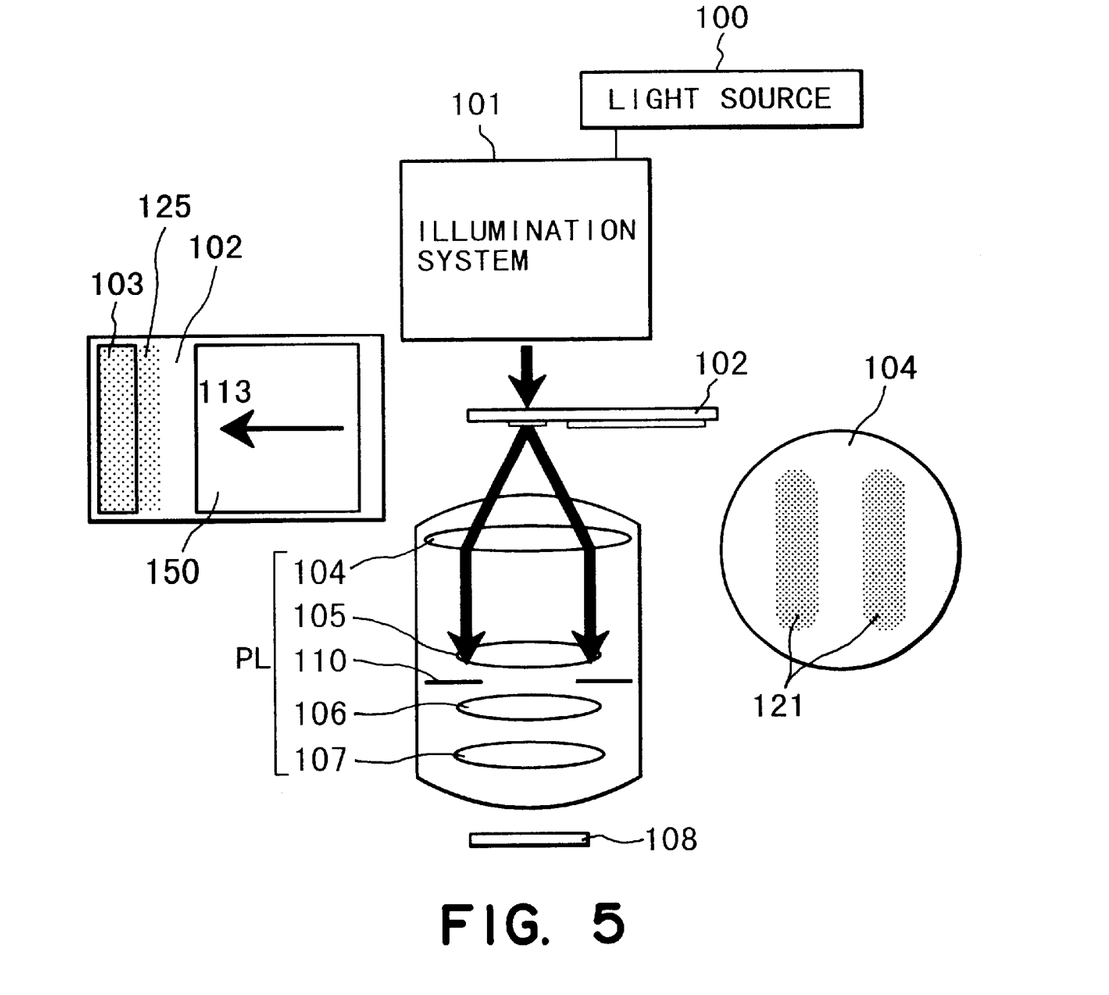
FIG. 5 is a schematic view of a main portion of a scanning exposure apparatus which uses an exposure method according to a second embodiment of the present invention.

FIG. 5 is a schematic view of a main portion of a second embodiment wherein the exposure method of the present invention is applied to a scanning exposure apparatus. The basis structure of the exposure apparatus of this embodiment is substantially the same as that of the first embodiment. In this embodiment, as compared with the first embodiment, the illumination light for the preparatory exposure, on the projection lens PL (particularly, on the lens 104 thereof), is not made revolutionally symmetrical with respect to the optical axis, but rather, it is set so as to mainly illuminate zones (complementary regions) 121 of the lens which are not illuminated by an ordinary exposure. The forked arrows inside the projection lens PL of FIG. 5 depict the light paths of transmission light, passing through the lens illumination mark. The illumination region to be defined on the lens may have any shape.

In accordance with this embodiment, by the preparatory exposure process described above, an illumination step or exposure step complementary to the ordinary exposure is carried out to the projection lens PL. As a result of it, substantially the whole surface of the lens can be uniformly illuminated, heated, and saturated. As regards the procedure, at the start of an ordinary exposure, the projection lens PL is heated revolutionally asymmetrically (in rectangular shape). As an example, after the exposure process to a first wafer is completed and when it is unloaded, the preparatory exposure step according to this embodiment may be carried out. Then, the projection lens PL is illuminated and heated revolutionally symmetrically, such that generation of an undesirable revolutionally asymmetric aberration during the exposure process to a subsequent wafer can be prevented effectively. The timing for performing the preparatory exposure may be determined in accordance with the variation characteristic of the projection lens PL to heat.

For example, in a case of a projection lens having a high sensitivity to heat, the preparatory exposure may have to be done for every wafer. For a projection lens of a low heat sensitivity, on the other hand, the preparatory exposure may be done for every several wafers or every one lot or, alternatively, for only a first wafer in a job to be carried out to plural lots. Further, for a wafer having a large shot number such as a 12-inch wafer, the preparatory exposure operation may be done during the exposure procedure of one wafer, by interrupting the successive shot exposures.

As regards the lens elements of the projection lens PL, the present invention is effective not only to those close to the reticle 102 (such as the lens 104) but also to those close to a pupil 110, such as lenses 105–107.

As regards the lens illumination mark 103 to be used in this embodiment, the optical elements shown in FIGS. 4A–4D described above may be modified into an optical element having a one-dimensional symmetric pattern, taking the axis C–C' as an axis of symmetry, rather than being revolutionally symmetric with respect to the axis C–C'.

The light for illuminating the lens illumination mark may be the exposure light (resist printing light), or it may be non-printing light of a wavelength different from that of the exposure light. Further, the present invention is not limited to a scan type exposure apparatus, but it is applicable also to a non-scan type ordinary stepper (step-and-repeat type projection exposure apparatus) where a reticle which might cause a revolutionally asymmetric aberration in a projection lens is used.

Figure 7:
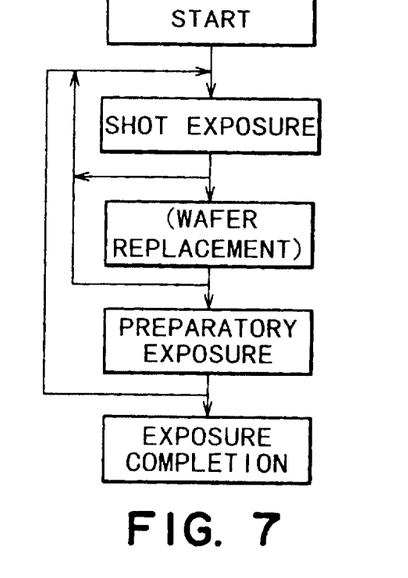
FIG. 7 is a flow chart for explaining the timing of preparatory exposure in the exposure method according to the present invention.

FIG. 7 is a flow chart for explaining the timing of the preparatory exposure in this embodiment.

In a device manufacturing method according to an embodiment of the present invention, a scanning exposure apparatus based an exposure method of any one of the embodiments described above is used. After an alignment process for a reticle and a wafer is completed, a device pattern formed on the reticle is projected and printed on the. wafer surface. After the exposure, the exposed wafer is processed by a developing treatment and the like, by which a device is produced.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus wherein a first object is illuminated with slit-like exposure light while the first object and a second object are scanningly moved at a speed ratio corresponding to a projection magnification of a projection optical system such that a pattern of the first object is projected onto the second object through the projection optical system, said apparatus comprising:

an illuminating device for illuminating a mark provided on the first object side with light having the same wavelength as that of the exposure light, wherein light from the mark is incident on the projection optical system whereby a revolutionally asymmetric aberration of the projection optical system due to an exposure is corrected or reduced.

2. A device manufacturing method for exposing a wafer to a device pattern by use of an exposure apparatus as recited in any one of claim 1, and for developing the exposed wafer.

3. An exposure apparatus wherein a first object is illuminated with a slit-like light beam while the first object and a second object are scanningly moved at a speed ratio corresponding to a projection magnification of a projection optical system such that a pattern of the first object is projected onto the second object through the projection optical system, said apparatus comprising:

an illuminating device for illuminating a mark provided on a stage for the first object, wherein light from the mark is incident on the projection optical system whereby a revolutionally asymmetric aberration of the projection optical system due to an exposure is corrected or reduced.

4. A device manufacturing method for exposing a wafer to a device pattern by use of an exposure apparatus as recited in claim 2, and for developing the exposed wafer.

5. An exposure apparatus wherein a first object is illuminated with a slit-like light beam while the first object and a second object are scanningly moved at a speed ratio corresponding to a projection magnification of a projection optical system such that a pattern of the first object is projected onto the second object through a projection optical system, said apparatus comprising:

an illuminating device for illuminating a mark provided on a stage for the first object, wherein light from the mark is incident on the projection optical system whereby at least one lens of the projection optical system is substantially thermally saturated.

6. A device manufacturing method for exposing a wafer to a device pattern by use of an exposure apparatus as recited in claim 4, and for developing the exposed wafer.

7. An exposure apparatus for illuminating a first object with exposure light and for projecting a pattern of a first object onto a second object through a projection optical system, said apparatus comprising:

an illuminating device for illuminating a mark provided on the first object side with light having the same wavelength as that of the exposure light, wherein light from the mark is incident on the projection optical system whereby a revolutionally asymmetric aberration of the projection optical system due to an exposure is corrected or reduced.

8. A device manufacturing method for exposing a wafer to a device pattern by use of an exposure apparatus as recited in claim 5, and for developing the exposed wafer.

9. An exposure apparatus for projecting a pattern of a first object onto a second object through a projection optical system, said apparatus comprising:

an illuminating device for illuminating a mark provided on a stage for the first object with exposure light, wherein light from the mark is incident on the projection optical system whereby a revolutionally asymmetric aberration of the projection optical system due to an exposure is corrected or reduced.

10. A device manufacturing method for exposing a wafer to a device pattern by use of an exposure apparatus as recited in claim 6, and for developing the exposed wafer.

11. An exposure apparatus for projecting a pattern of a first object onto a second object through a projection optical system, said apparatus comprising:

an illuminating device for illuminating a mark provided on a stage for the first object, wherein light from the mark is incident on the projection optical system whereby at least one lens of the projection optical system is substantially thermally saturated.

12. A device manufacturing method for exposing a wafer to a device pattern by use of an exposure apparatus as recited in claim 8, and for developing the exposed wafer.

* * * * *

UNITED STATES PATENT AND TRADEMARK OFFICE
CERTIFICATE OF CORRECTION

PATENT NO. : 6,603,530 B1  Page 1 of 1
DATED : August 5, 2003
INVENTOR(S) : Michio Kohno It is certified that error appears in the above-identified patent and that said Letters Patent is hereby corrected as shown below:

<u>Column 8,</u>
Line 24, "based" should read -- based on --.
Line 27, "the." should read -- the --.
Line 53, "any one of" should be deleted.

<u>Column 10,</u>
Line 27, "claim 8," should read -- claim 11, --.

Signed and Sealed this

Thirteenth Day of January, 2004

JON W. DUDAS
*Acting Director of the United States Patent and Trademark Office*